(12) United States Patent
Abdulaziz et al.

(10) Patent No.: US 11,641,190 B2
(45) Date of Patent: May 2, 2023

(54) RING OSCILLATOR WITH RESONANCE CIRCUITS

(71) Applicant: Telefonaktiebolaget LM Ericsson (publ), Stockholm (SE)

(72) Inventors: Mohammed Abdulaziz, Lund (SE); Henrik Sjöland, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/621,914

(22) PCT Filed: Jul. 3, 2019

(86) PCT No.: PCT/EP2019/067902
§ 371 (c)(1),
(2) Date: Dec. 22, 2021

(87) PCT Pub. No.: WO2021/001040
PCT Pub. Date: Jan. 7, 2021

(65) Prior Publication Data
US 2022/0271741 A1 Aug. 25, 2022

(51) Int. Cl.
*H03K 3/03* (2006.01)
*H03B 5/12* (2006.01)
*H03L 7/099* (2006.01)

(52) U.S. Cl.
CPC ......... *H03K 3/0315* (2013.01); *H03B 5/1228* (2013.01); *H03B 5/1237* (2013.01); *H03L 7/0995* (2013.01)

(58) Field of Classification Search
CPC .................................................. H03K 3/0315
(Continued)

(56) References Cited

U.S. PATENT DOCUMENTS 8,779,861 B2    7/2014 Wang
11,329,605 B1 *  5/2022 Xue ..................... H03B 5/1215
(Continued)

OTHER PUBLICATIONS

Chen, Yue, et al., "A 350-mV 2.4GHz Quadrature Oscillator with Nearly Instantaneous Start-up Using Series LC Tanks", IEEE Asian Solid-State Circuits Conference, Seoul, Korea, Nov. 6-8, 2017, 105-108.
(Continued)

*Primary Examiner* — Joseph Chang
(74) *Attorney, Agent, or Firm* — Muphy, Bilak & Homiller, PLLC

(57) ABSTRACT

An oscillator circuit (15) is disclosed. It comprises N amplifier circuits ($A_1$-$A_4$), connected in a ring and has a first and a second supply terminal ($s_1$, $s_2$). Each amplifier circuit ($A_1$-$A_4$) comprises an input transistor ($M_1$) having its gate connected to the input (in) of the amplifier circuit, its drain connected to an internal node (x) of the amplifier circuit, and its source connected to the first supply terminal (si). Furthermore, each amplifier circuit ($A_1$-$A_4$) comprises a first resonance circuit ($R_1$) comprising a first inductor ($L_s$) and a first capacitor ($C_s$), wherein the first inductor ($L_s$) is connected between the internal node (x) and the output (out) of the amplifier circuit, and the first capacitor ($C_s$) is connected between the output (out) of the amplifier circuit and one of the first and the second supply terminals ($s_1$, $s_2$). Moreover, each amplifier circuit ($A_1$-$A_4$) comprises a second resonance circuit ($R_2$) comprising a second inductor ($L_p$) and a second capacitor ($C_p$), wherein the second inductor ($L_p$) and the second capacitor ($C_p$) are connected in parallel between the internal node (x) and the second supply terminal ($s_2$).

17 Claims, 6 Drawing Sheets

(58) Field of Classification Search
USPC .......................................................... 331/57
See application file for complete search history.

(56) References Cited

U.S. PATENT DOCUMENTS

| | | | | |
|---|---|---|---|---|
| 2005/0265053 | A1* | 12/2005 | Higashi | H03L 7/0814 363/71 |
| 2009/0002084 | A1* | 1/2009 | Inoue | H03B 5/1203 257/E27.014 |
| 2011/0298549 | A1 | 12/2011 | Luong et al. | |
| 2015/0372665 | A1 | 12/2015 | Tohidian et al. | |
| 2019/0355511 | A1* | 11/2019 | Dekker | H03B 5/1221 |

OTHER PUBLICATIONS

Chi, Taiyun, et al., "A Multi-Phase Sub-Harmonic Injection Locking Technique for Bandwidth Extension in Silicon-Based THz Signal Generation", Proceedings of the IEEE 2014 Custom Integrated Circuits Conference, 2014, 1-4.

Hajimiri, Ali, et al., "A General Theory of Phase Noise in Electrical Oscillators", IEEE Journal of Solid-State Circuits, vol. 33, No. 2, Feb. 1998, 179-194.

Hegazi, Emad, et al., "A Filtering Technique to Lower LC Oscillator Phase Noise", IEEE Journal of Solid-State Circuits, vol. 36, No. 12, Dec. 2001, 1921-1930.

Hwang, J. T., et al., "New High Performance and Wide Range Tunable Two-Stage 3GHz CMOS RF Hetero-Linked Oscillators", Proceedings of the 25th European IEEE Solid-State Circuits Conference, 1999, 354-357.

Pepe, Federico, et al., "On the Remarkable Performance of the Series-Resonance CMOS Oscillator", IEEE Transactions on Circuits and Systems-1: Regular Papers, vol. 65, No. 2, Feb. 2018, 531-542.

Rong, Sujiang, et al., "V-Band Varactor-less Interpolative-Phase-Tuning Oscillators with Multiphase Outputs", 2010 IEEE Custom Integrated Circuits Conference (CICC), Piscataway, NJ, 2010, 1-4.

* cited by examiner

RING OSCILLATOR WITH RESONANCE CIRCUITS

TECHNICAL FIELD

The present invention relates to an oscillator circuit.

BACKGROUND

The voltage-controlled oscillator (VCO) is a key part in many electronic systems, especially for wireless communication transceivers where it is used for local oscillator generation for frequency up/down conversion. Reciprocal mixing of phase noise is often a dominant noise source in receivers when large interference is close to the frequency of the received signal. The phase noise can be reduced by increasing the supply voltage and the signal voltage swing of the oscillator. Unfortunately, this option is less attractive in state-of-the-art CMOS technologies for reliability reasons. Low supply voltage oscillators are therefore preferred.

Quadrature VCOs are attractive because they can be used to generate IQ signals directly, thereby avoiding the use of power-hungry frequency dividers. Since a series resonant cell introduces a 90° phase shift, a quadrature oscillator is easily designed by connecting four series resonant cells in a ring, as shown in FIG. 1. This type of circuit is disclosed in F. Pepe, A. Bevilacqua and P. Andreani, "On the Remarkable Performance of the Series-Resonance CMOS Oscillator," in *IEEE Transactions on Circuits and Systems I: Regular Papers*, vol. 65, No. 2, pp. 531-542, February 2018. The use of complementary devices to increase the effective transconductance at low supply voltage results in high power efficiency.

SUMMARY

According to a first aspect, an oscillator circuit is provided. It comprises N amplifier circuits, in the following numbered 1 to N. For each j∈{1,2, . . . , N−1}, an output of amplifier circuit j is connected to an input of the amplifier circuit j+1. Furthermore, the output of the amplifier circuit N is connected to the input of the amplifier circuit 1. Moreover, the oscillator circuit has a first and a second supply terminal configured to receive a supply voltage between the first and the second supply terminal. Each of the N amplifier circuits comprises an input transistor having its gate connected to the input of the amplifier circuit, its drain connected to an internal node of the amplifier circuit, and its source connected to the first supply terminal. Furthermore, each of the N amplifier circuits comprises a first resonance circuit comprising a first inductor and a first capacitor, wherein the first inductor is connected between the internal node and the output of the amplifier circuit, and the first capacitor is connected between the output of the amplifier circuit and one of the first and the second supply terminals. Moreover, each of the N amplifier circuits comprises a second resonance circuit comprising a second inductor and a second capacitor, wherein the second inductor and the second capacitor are connected in parallel between the internal node and the second supply terminal.

In some embodiments, N=4.

In some embodiments where N=4, the oscillator circuit comprises a first transistor, a second transistor, a third transistor, and a fourth transistor. The first transistor has its gate connected to the output of amplifier circuit 3, its source connected to the first supply terminal, and its drain connected the drain of the input transistor of amplifier circuit 1.

The second transistor has its gate connected to the output of amplifier circuit 4, its source connected to the first supply terminal, and its drain connected the drain of the input transistor of amplifier circuit 2. The third transistor has its gate connected to the output of amplifier circuit 1, its source connected to the first supply terminal, and its drain connected the drain of the input transistor of amplifier circuit 3. The fourth transistor has its gate connected to the output of amplifier circuit 2, its source connected to the first supply terminal, and its drain connected the drain of the input transistor of amplifier circuit 4.

In some embodiments where N=4, each amplifier circuit comprises a further transistor connecting the source of the input transistor of the same amplifier circuit to the first supply terminal. The drain of the further transistor is connected to the source of the input transistor of the same amplifier circuit and the source of the further transistor is connected to the first supply terminal. The gate of the further transistor of amplifier circuit 1 is connected to the output of the amplifier circuit 3. The gate of the further transistor of amplifier circuit 2 is connected to the output of the amplifier circuit 4. The gate of the further transistor of amplifier circuit 3 is connected to the output of the amplifier circuit 1. The gate of the further transistor of amplifier circuit 4 is connected to the output of the amplifier circuit 2.

In some embodiments, each of the N amplifier circuits comprises an attenuator circuit connecting the gate of the input transistor to the input of the amplifier circuit.

In some embodiments, each of the N amplifier circuits comprises a cascode transistor connecting the drain of the input transistor to the internal node.

The first resonance circuit may be configured to have a first resonance frequency $f_o$ and the second resonance circuit may be configured to have a second resonance frequency $f_P \geq 2 f_o$. In some embodiments, $f_P$ is an integer multiple of $f_o$.

The oscillator circuit may be a controlled oscillator circuit, such as a voltage-controlled oscillator circuit or a digitally-controlled oscillator circuit According to a second aspect, there is provided a frequency synthesizer circuit comprising the oscillator circuit of the first aspect. The frequency synthesizer circuit may, for instance, be a phase-locked loop circuit.

According to a third aspect, there is provided an integrated circuit comprising the oscillator circuit of the first aspect.

According to a fourth aspect, there is provided an electronic apparatus comprising the oscillator circuit of the first aspect. The electronic apparatus may, for instance, be a communication apparatus, such as a wireless communication device for a cellular communications system or a base station for a cellular communications system.

DETAILED DESCRIPTION

It should be emphasized that the term "comprises/comprising" when used in this specification is taken to specify the presence of stated features, integers, steps, or components, but does not preclude the presence or addition of one or more other features, integers, steps, components, or groups thereof.

Figure 2:
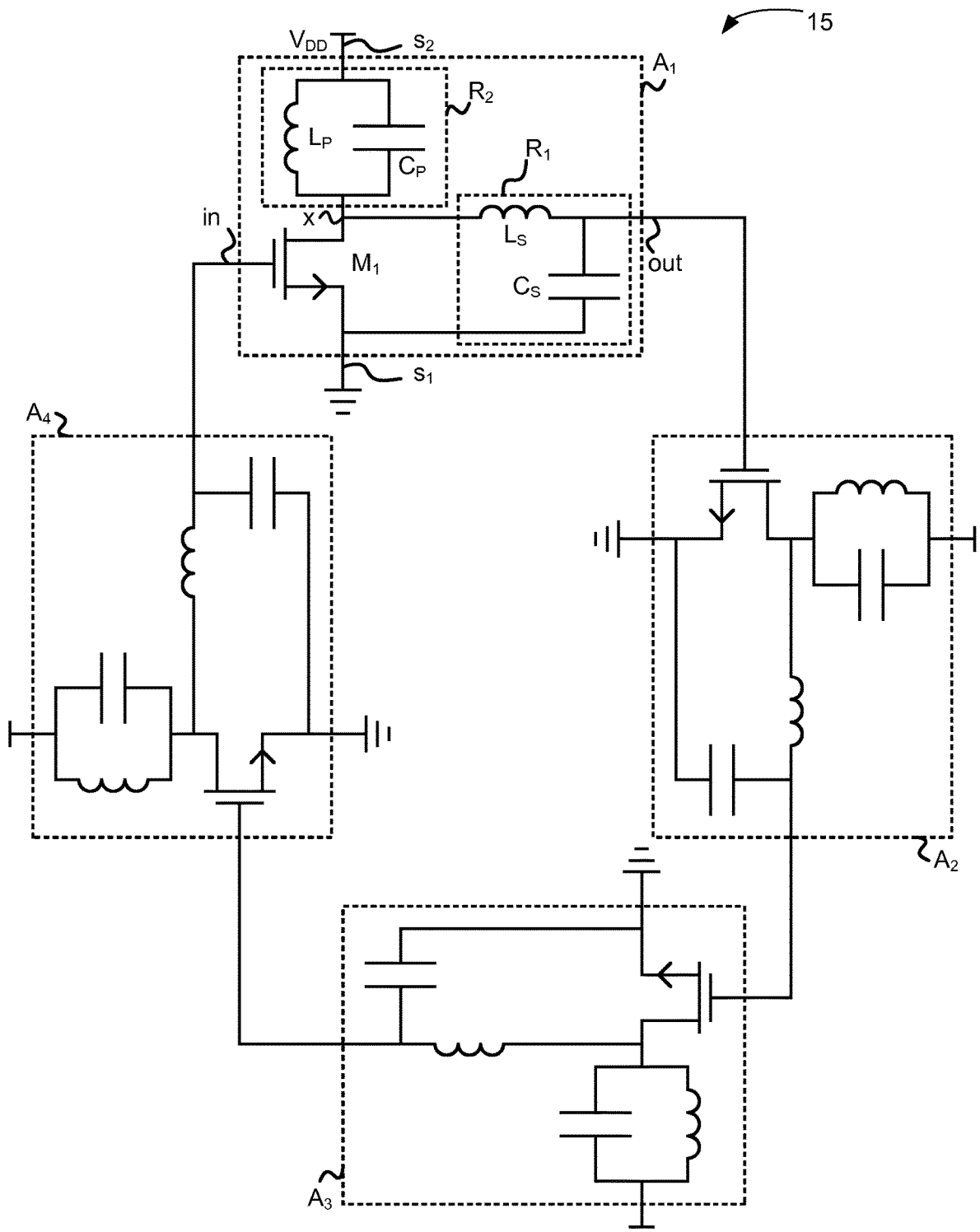
FIGS. 2-7 show schematic circuit diagrams of embodiments of the present disclosure.

FIG. 2 is a schematic circuit diagram of an oscillator circuit 15 according to an embodiment of the present disclosure. It comprises N amplifier circuits $A_1$-$A_4$. In embodiments shown in this disclosure, N=4. However, other values of N may be used in other embodiments, such as integer multiples of 4. In the following description, the amplifier circuits are numbered 1 to N. In the drawings, amplifier circuit j (or "the j:th amplifier circuit") is provided with the reference sign $A_j$. The amplifier circuits are connected in a ring, wherein for each $j \in \{1, 2, \ldots, N-1\}$, an output out of the j:th amplifier circuit $A_j$ is connected to an input in of the (j+1):th amplifier circuit $A_{j+1}$. The output of the N:th amplifier circuit $A_N$ is connected to the input of the 1:st amplifier circuit $A_1$. Furthermore, the oscillator circuit 15 comprises a first supply terminal $s_1$ and a second supply terminal $s_2$ configured to receive a supply voltage between the first supply terminal $s_1$ and the second supply terminal $s_2$.

Reference signs are shown in the drawings for the 1:st amplifier circuit $A_1$. The same reference signs apply for the other amplifier circuits $A_2$-$A_4$, as would be readily understood by the skilled person. Each of the N amplifier circuits $A_1$-$A_4$ comprises an input transistor $M_1$ having its gate connected to the input in of the amplifier circuit, its drain connected to an internal node marked x, and its source connected to the first supply terminal $s_1$. In the drawings, the input transistor M1 is an NMOS transistor, and the second supply terminal $s_2$ is connected to an electrical potential (labeled $V_{DD}$) which is higher than the electrical potential (or "ground", shown in the drawings with a ground symbol) that the first supply terminal $s_1$ is connected to. However, in other embodiments, the input transistor M1 may be a PMOS transistor, in which case the first supply terminal $s_1$ would be connected to the higher electrical potential and the second supply terminal $s_2$ would be connected to the lower electrical potential. Said supply voltage is the difference between the higher and the lower electrical potential. Furthermore, other types of transistors may be used as well, such as bipolar transistors or other types of field-effect transistors.

Each of the amplifier circuits $A_1$-$A_4$ comprises a first resonance circuit $R_1$ comprising a first inductor $L_S$ and a first capacitor $C_S$. The first inductor $L_S$ is connected between the internal node x and the output out of the amplifier circuit. The first capacitor $C_S$ is connected between the output out of the amplifier circuit and one of the first and the second supply terminals $s_1$, $s_2$. In the drawings, the first capacitor $C_S$ is connected to the first supply terminal $s_1$, but in other embodiments it may be connected to the second supply terminal $s_2$ instead.

Furthermore, each of the amplifier circuits $A_1$-$A_4$ comprises a second resonance circuit $R_2$ comprising a second inductor $L_P$ and a second capacitor $C_P$. The second inductor $L_P$ and the second capacitor $C_P$ are connected in parallel between the internal node x and the second supply terminal $s_2$.

Figure 1:
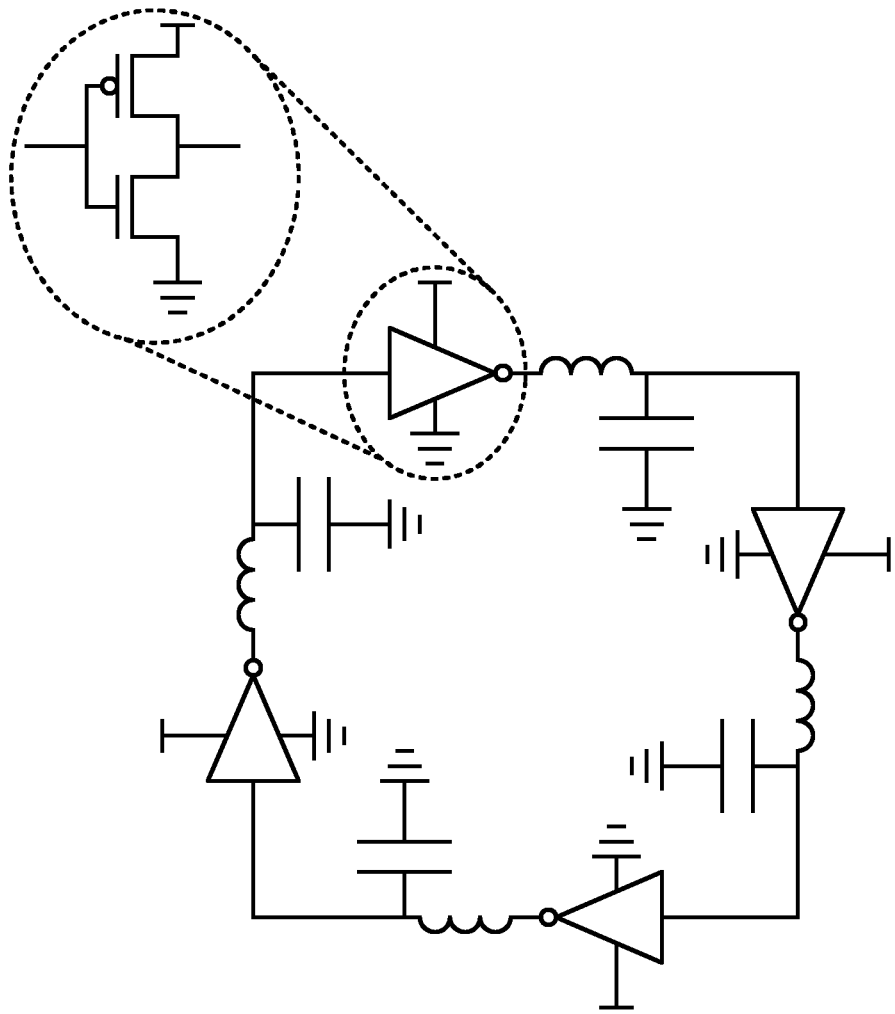
FIG. 1 is a circuit diagram of a quadrature oscillator.

When CMOS inverters are used in an oscillator as in FIG. 1, a relatively high supply voltage is needed in order to start the oscillator. By including the second resonance circuit $R_2$ instead of a transistor, the required supply voltage can be reduced in embodiments of the present disclosure compared with the oscillator in FIG. 1. Simulations indicate that supply voltages only slightly higher than the threshold voltage of the input transistor $M_1$ is sufficient in some applications. Furthermore, since the CMOS inverter has both a PMOS transistor and an NMOS transistor driven by its input, a relatively high parasitic capacitance is obtained. With the amplifier circuits used in embodiments of the present disclosure, the use of complementary transistors (i.e. both NMOS and PMOS) is not necessary, whereby parasitic capacitance can be reduced compared with the oscillator in FIG. 1. The parasitics are lower if an NMOS transistor is used as the input transistor $M_1$ compared with if a PMOS transistor is used as the input transistor $M_1$, and NMOS transistors are generally faster than PMOS transistors, so using an NMOS transistor as the input transistor $M_1$ is advantageous for obtaining high oscillation frequencies. Furthermore, the inclusion of the second resonance circuit $R_2$ instead of a transistor provides more degrees of freedom to control the impedance of the harmonics, and to shape the drain waveform for high efficiency and low phase noise, in embodiments of the present disclosure compared with the oscillator in FIG. 1.

Figure 3:
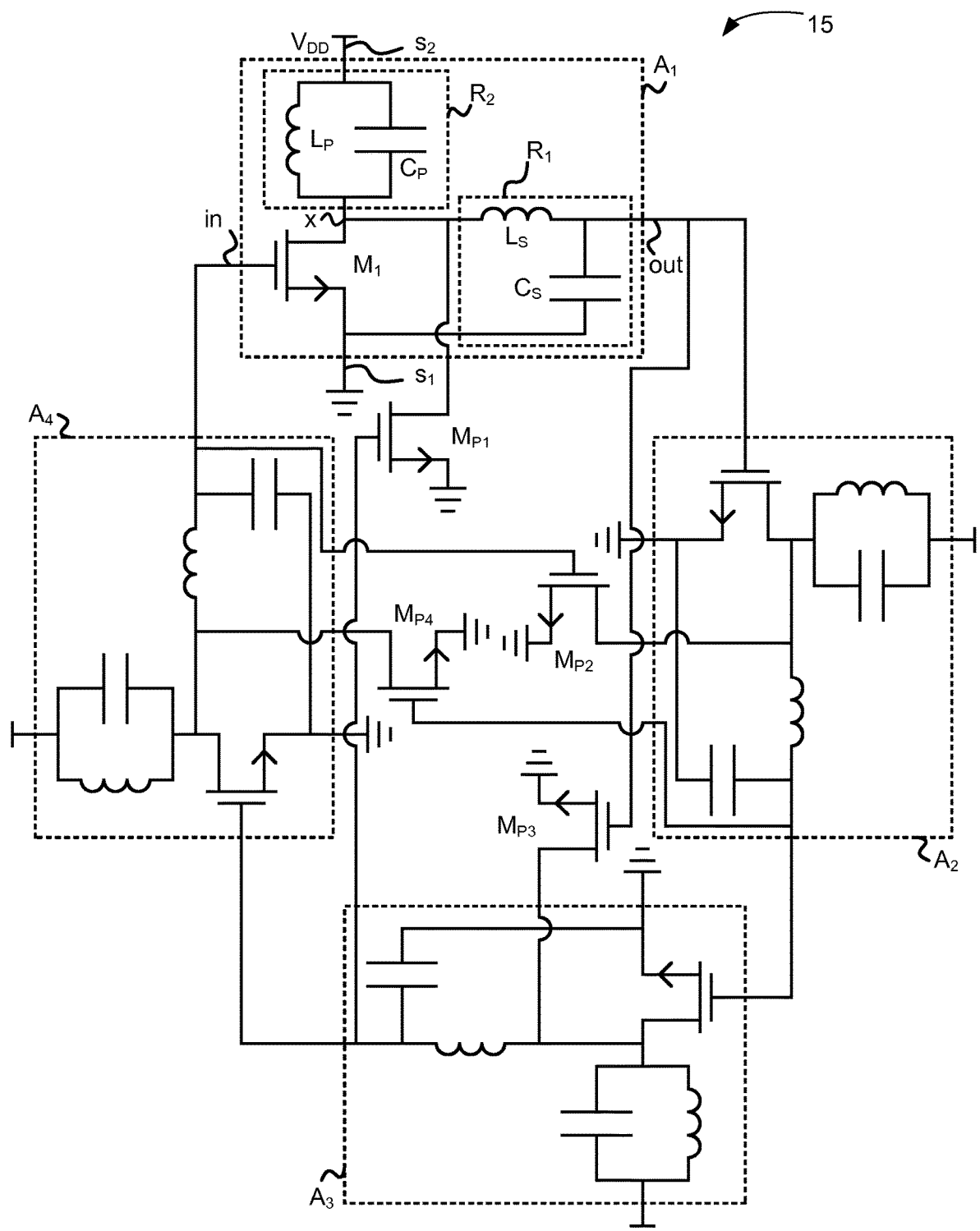

FIG. 3 is a schematic circuit diagram of another embodiment of the oscillator circuit 15. In addition to the circuitry shown in FIG. 2, it comprises transistors $M_{P1}$, $M_{P2}$, $M_{P3}$, and $M_{P4}$. In FIG. 3, the transistors $M_{P1}$, $M_{P2}$, $M_{P3}$, and $M_{P4}$ are NMOS transistors. In embodiments where the input transistor M1 in each amplifier circuit $A_1$-$A_4$ is a PMOS transistor, transistors $M_{P1}$, $M_{P2}$, $M_{P3}$, and $M_{P4}$ may be implemented as PMOS transistors.

Transistor $M_{P1}$ has its gate connected to the output out of the 3rd amplifier circuit $A_3$, its source connected to the first supply terminal $s_1$, and its drain connected the drain of the input transistor $M_1$ of the 1:st amplifier circuit $A_1$.

Transistor $M_{P2}$ has its gate connected to the output out of the 4:th amplifier circuit $A_4$, its source connected to the first supply terminal $s_1$, and its drain connected the drain of the input transistor $M_1$ of the 2:nd amplifier circuit $A_2$.

Transistor $M_{P3}$ has its gate connected to the output out of the 1:st amplifier circuit $A_1$, its source connected to the first supply terminal $s_1$, and its drain connected the drain of the input transistor $M_1$ of the 3rd amplifier circuit $A_3$.

The transistor $M_{P4}$ has its gate connected to the output out of the 2:nd amplifier circuit $A_2$, its source connected to the first supply terminal $s_1$, and its drain connected the drain of the input transistor $M_1$ of the 4:th amplifier circuit 4 $A_4$.

Figure 4:
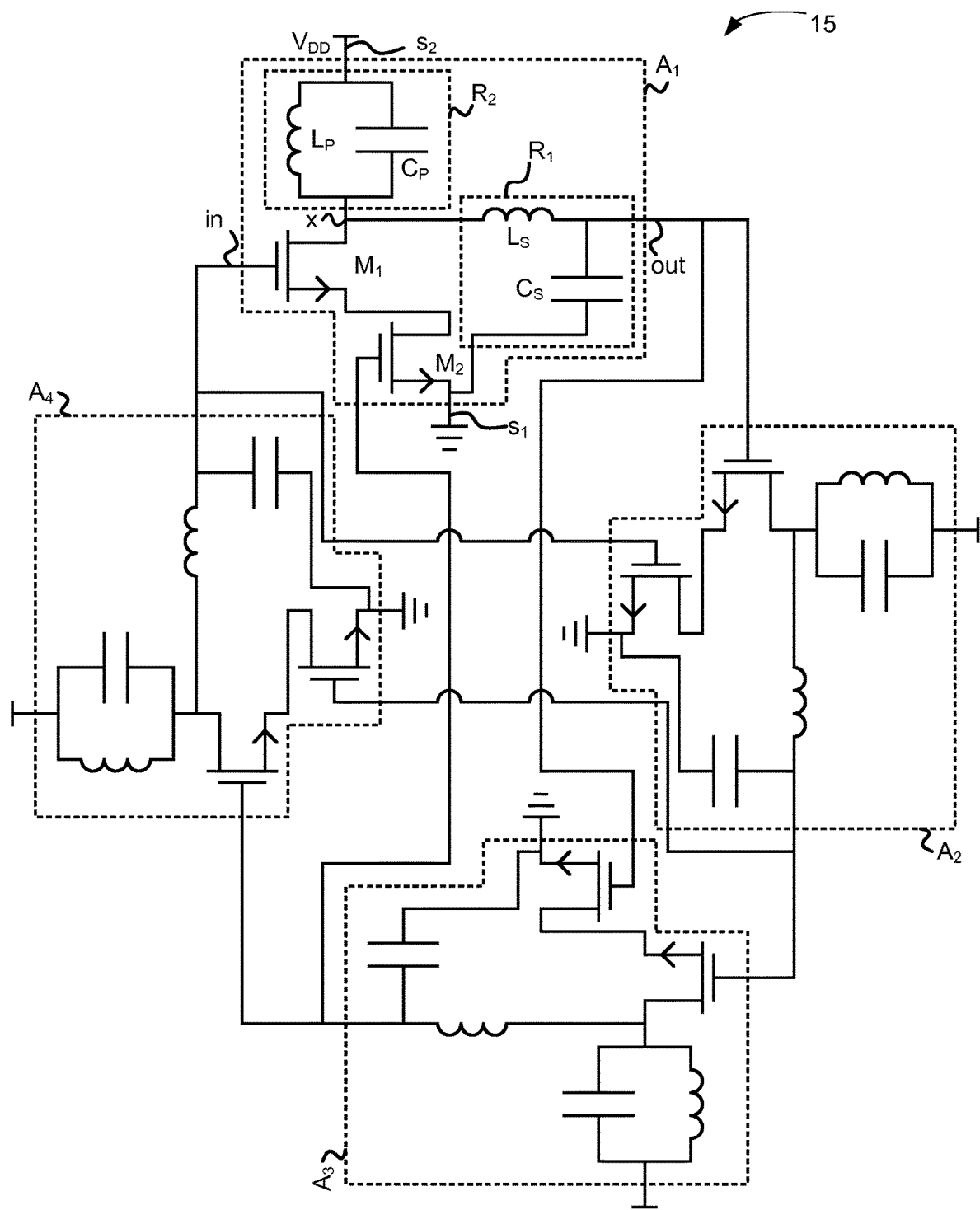

The additional transistors $M_{P1}$, $M_{P2}$, $M_{P3}$, and $M_{P4}$ in FIG. 3 provides suppression of non-quadrature oscillation modes providing a more robust quadrature oscillator. Four stage oscillators can, in theory, produce two or four phases. In FIG. 3, signals are injected using the parallel additional transistors $M_{P1}$, $M_{P2}$, $M_{P3}$, and $M_{P4}$ to ensure quadrature phase relation and prevent other modes of oscillation such as having only two phases in the oscillator instead of four. In FIG. 4 we inject the signals using series devices which results in still high figure of merit and reduced power consumption. The purpose is the same to force the oscillator to produce four phases with 90 degrees separation.

FIG. 4 is a schematic circuit diagram of another embodiment of the oscillator circuit 15. In addition to the circuitry shown in FIG. 2, each amplifier circuit $A_1$-$A_4$ comprises a further transistor $M_2$ connecting the source of the input transistor $M_1$ of the same amplifier circuit $A_1$-$A_4$ to the first supply terminal $s_1$. The drain of the further transistor $M_2$ is connected to the source of the input transistor $M_1$ of the same amplifier circuit $A_1$-$A_4$. The source of the further transistor $M_2$ is connected to the first supply terminal $s_1$. The gate of the further transistor $M_2$ of the 1:st amplifier circuit $A_1$ is connected to the output of the 3:rd amplifier circuit $A_3$. The gate of the further transistor $M_2$ of the 2:nd amplifier circuit $A_2$ is connected to the output of the 4:th amplifier circuit $A_4$. The gate of the further transistor $M_2$ of the 3:rd amplifier circuit $A_3$ is connected to the output of the 1:st amplifier circuit $A_1$. The gate of the further transistor $M_2$ of the 4:th amplifier circuit $A_4$ is connected to the output of the 2:nd amplifier circuit $A_2$. The further transistor $M_2$ in each amplifier circuit $A_1$-$A_4$ in FIG. 4 provides suppression of non-quadrature oscillation modes. The function is similar to that described above in the context of FIG. 3, but in FIG. 4, the signals are instead injected using the series-connected further transistor $M_2$.

Figure 5:
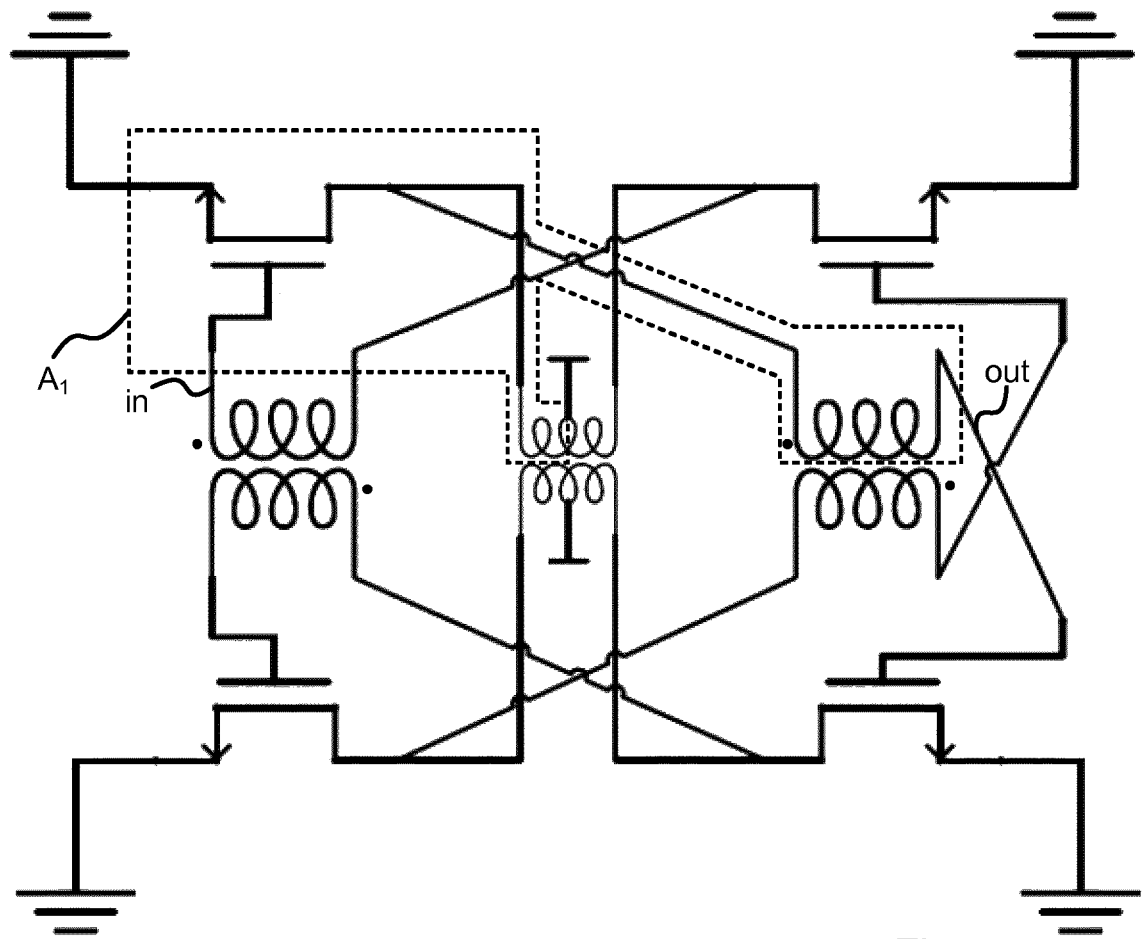

FIG. 5 illustrates how inductors may be implemented pairwise as transformers for the embodiment illustrated in FIG. 2 to save chip area. For simplicity, the capacitors are not shown in FIG. 5. First of all, since the signal currents in each pair of inductors placed together as a transformer are 180° out of phase, the mutual inductance between the inductors in the pair increases the effective inductance of each inductor in the pair. This allows the physical size of the inductors to be reduced. Furthermore, the inductors may be implemented with an interleaved layout on the chip surface, which further helps to save space.

Figure 6:
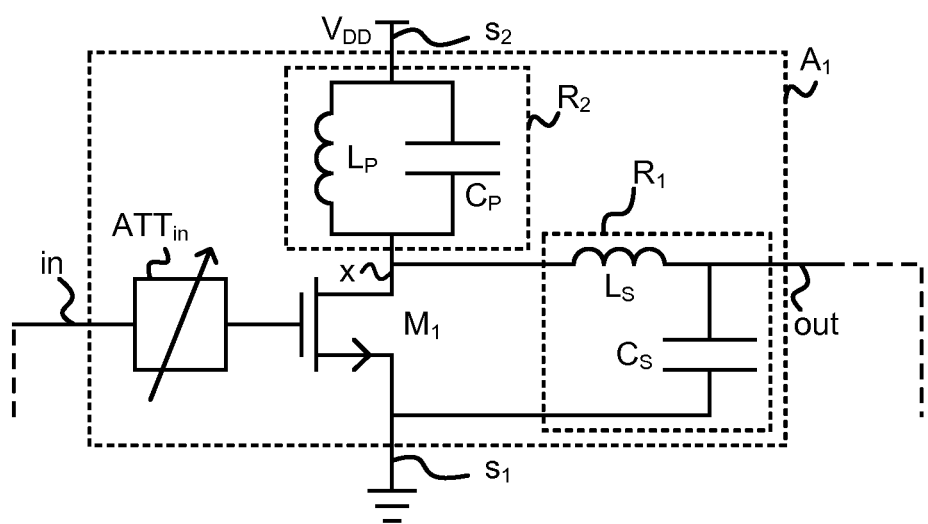

FIG. 6 is a schematic circuit diagram of another embodiment of the oscillator circuit 15. In FIG. 6, each of the amplifier circuits $A_1$-$A_4$ comprises an attenuator circuit $ATT_{in}$ connecting the gate of the input transistor $M_1$ to the input in of the amplifier circuit. In FIG. 6, only amplifier circuit $A_1$ is shown. The other amplifier circuits $A_2$-$A_4$ are implemented in the same way. The attenuator circuit $ATT_{in}$ may e.g. be implemented as a capacitive voltage divider. The attenuator circuit $ATT_{in}$ allows the supply voltage to be increased without damaging the input transistor $M_1$. By increasing the supply voltage, an improved (reduced) phase noise can be obtained.

Figure 7:
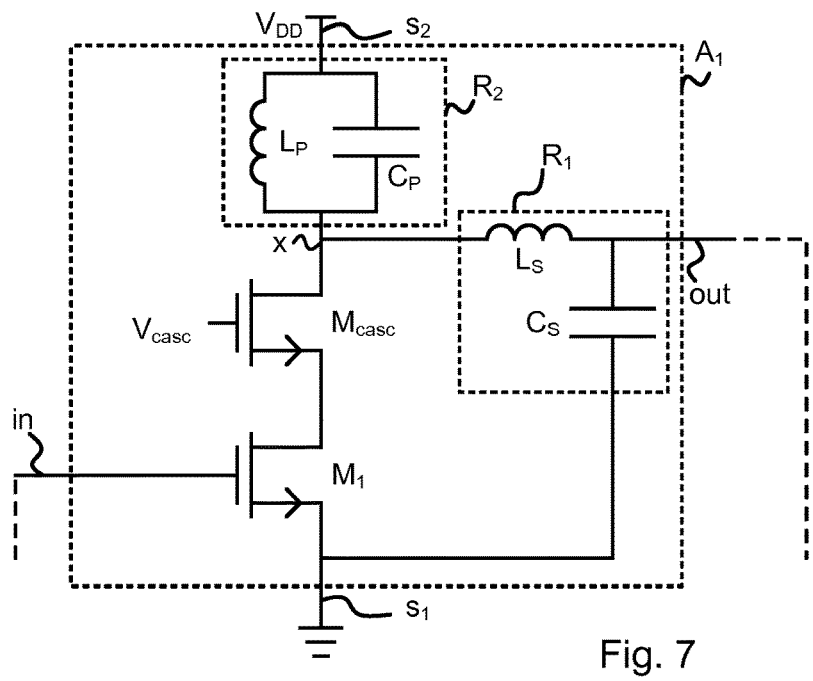

FIG. 7 is a schematic circuit diagram of another embodiment of the oscillator circuit 15. In FIG. 6, each of the amplifier circuits $A_1$-$A_4$ comprises a cascode transistor $M_{casc}$ connecting the drain of the input transistor $M_1$ to the internal node x. The cascode transistor $M_{casc}$ is of the same type as the input transistor $M_{casc}$. The source of the cascode transistor $M_{casc}$ is connected to the drain of the input transistor $M_1$. The drain of the cascode transistor $M_{casc}$ is connected to the internal node x. The gate of the cascode transistor $M_{casc}$ is biased with a voltage $V_{casc}$. In FIG. 7, only amplifier circuit $A_1$ is shown. The other amplifier circuits $A_2$-$A_4$ are implemented in the same way. The inclusion of the cascode transistor $M_{casc}$ increases the voltage swing that the oscillator circuit 15 can handle.

In some embodiments of the oscillator circuit 15, the first resonance circuit $R_1$ is tuned or otherwise configured to have a first resonance frequency $f_0$. The first resonance frequency $f_0$ is typically equal to or relatively close to the oscillation frequency of the oscillator 15.

In some embodiments of the oscillator circuit 15, the second resonance circuit $R_2$ is also tuned or otherwise configured to have the same resonance frequency $f_0$. This facilitates keeping the amount of fundamental frequency current drawn by the second resonance circuit $R_2$ relatively low. However, the inventors have realized that higher DC to RF conversion efficiency and oscillator phase noise figure of merit (FoM) can be achieved by a more suitable harmonic termination. This is achieved by a relatively low drain voltage and current waveform overlap, similar to a class-E power amplifier.

The embodiment of the oscillator circuit 15 shown in FIG. 3 has been simulated with the second resonance circuit $R_2$ tuned to a resonance frequency $f_P$. In a first simulation, $f_P = f_0$. It was observed that the resulting drain current is rich in harmonics due to a class C bias regime, but more importantly a considerable current is conducted when the drain voltage level is high. This results in a relatively poor DC-RF conversion efficiency. Moreover, the conduction at zero crossings is a major source of unwanted phase noise.

In subsequent simulations, $f_P = nf_0$, where $n=2,3,4,5,6$. That is, the second resonance circuit $R_2$ was tuned to one of the harmonics of $f_0$. This results in class-E like operation. In such a regime the efficiency is boosted (compared with $f_P = f_0$), and the phase noise is improved thanks to the reduced current conduction in the voltage zero-crossings. For instance, the simulations showed that, when the tank is tuned to the second harmonic (i.e. $n=2$), the phase noise at 100 MHz offset from a 3 GHz carrier and the FoM could be improved by more than 7 dB compared with when $f_P = f_0$. Similar results were obtained for values of $n \geq 3$. The quantitative results of course depend on the particular component models and frequencies used in the simulations. However, qualitatively, the results hold for other component models and frequencies as well. The transistor models used in the simulations were from a low-power 22 nm CMOS process, and the inductors used in the simulations had a Q value of about 10 at 3 GHz. Component parameters used in the simulations are indicated in the table below

| Parameter | Value |
| --- | --- |
| W/L (Width/Length) of $M_1$ | 200 μm/18 nm |
| W/L of $M_2$ | 100 μm/18 nm |
| $L_S$ | 1 nH |
| $C_S$ | 2 pF |
| $L_P$ | swept from 1 nH to 166 pH |
| $C_P$ | swept from 2 pF to 333 fF |
| $V_{DD}$ | 200 mV |

According to some embodiments, in view of the above, the second resonance circuit $R_2$ is configured to have a second resonance frequency $f_P \geq 2f_0$. In particular, in some embodiments, $f_P$ is an integer multiple of $f_0$.

According to some embodiments, the oscillator circuit 15 is a voltage-controlled oscillator (VCO) circuit. For instance, each amplifier circuit $A_1$-$A_4$ may comprise a first voltage-controlled capacitor, such as a varactor, (not shown) connected in parallel with the capacitor $C_S$ for controlling the oscillation frequency by controlling the resonance frequency of the resonance circuit $R_1$. The first voltage-controlled capacitor may be controlled via a control voltage. Each amplifier circuit $A_1$-$A_4$ may further comprise a second voltage-controlled capacitor, such as a varactor, (not shown) connected in parallel with the capacitor $C_P$ for tuning the resonance frequency of the resonance circuit $R_2$. The second voltage-controlled capacitor may be controlled via a control voltage, such as the same control voltage that controls the first voltage-controlled capacitor.

According to some embodiments, the oscillator circuit 15 is a digitally-controlled oscillator (VCO) circuit. For instance, each amplifier circuit $A_1$-$A_4$ may comprise a first digitally controlled capacitor connected in parallel with the capacitor $C_S$ for controlling the oscillation frequency by controlling the resonance frequency of the resonance circuit $R_1$. Each amplifier circuit $A_1$-$A_4$ may further comprise a second digitally controlled capacitor (not shown) connected in parallel with the capacitor $C_P$ for tuning the resonance frequency of the resonance circuit $R_2$.

Figure 8:
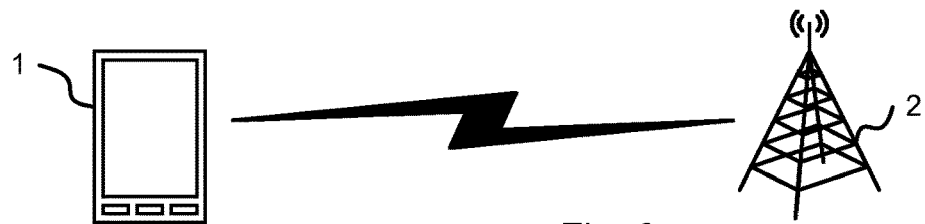
FIG. 8 illustrates a communication environment.

FIG. 8 illustrates a communication environment wherein embodiments of the present invention may be employed. A wireless communication device 1, or wireless device 1 for short, of a cellular communications system is in wireless communication with a radio base station 2 of the cellular communications system. The wireless device 1 may be what is generally referred to as a user equipment (UE). The wireless devices 1 is depicted in FIG. 8 as a mobile phone, but may be any kind of device with cellular communication capabilities, such as a tablet or laptop computer, machine-type communication (MTC) device, or similar. Furthermore, a cellular communications system is used as an example in this disclosure. However, embodiments of the present disclosure may be applicable in other types of systems as well, such as but not limited to WiFi systems.

The radio base station 2 and wireless device 1 are examples of what in this disclosure is generically referred to as communication apparatuses. Embodiments are described below in the context of a communication apparatus in the form of the radio base station 2 or wireless device 1. However, other types of communication apparatuses can be considered as well, such as a WiFi access point or WiFi enabled device.

Figure 9:
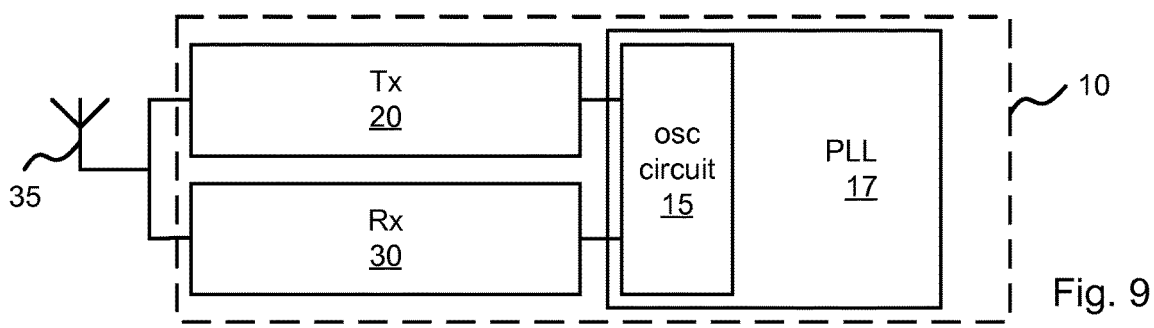
FIG. 9 illustrates a transceiver circuit.

FIG. 9 is a block diagram of an embodiment of a transceiver circuit 10, which can be comprised in a communication apparatus, such as the radio base station 2 or the wireless device 1. In the embodiment illustrated in FIG. 9, the transceiver circuit 10 comprises the oscillator circuit 15. As illustrated in FIG. 9, the oscillator circuit 15 may be comprised in a frequency synthesizer, such as a phase-locked loop (PLL) 17.

Furthermore, in the embodiment illustrated in FIG. 9, the transceiver circuit 10 comprises a transmitter circuit 20 and a receiver circuit 30, which may utilize the oscillating signal generated by the oscillator circuit 15 as local oscillator signals. For instance, the local oscillator signals may be utilized for driving one or more mixer circuits in the transmitter circuit 20 and/or the receiver circuit 30. In FIG. 9, the transmitter circuit 20 and the receiver circuit 30 are illustrated as connected to the same antenna 35. However, this is only an example. In some embodiments, separate transmit and receive antennas may be used.

Figure 10:
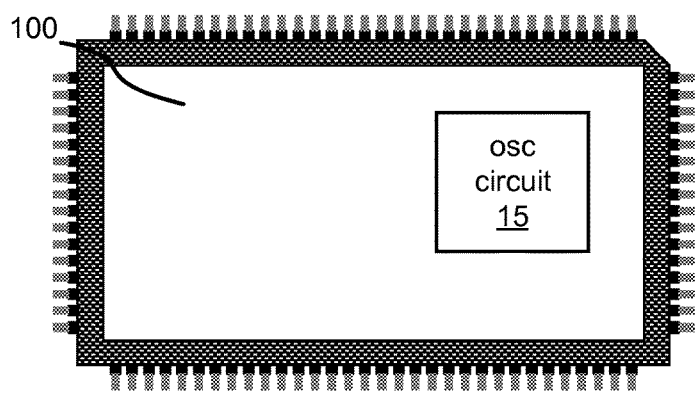
FIG. 10 illustrates an integrated circuit.

Embodiments of the oscillator circuit 15 are suitable for integration on an integrated circuit. This is schematically illustrated in FIG. 10, showing an integrated circuit 100 comprising the oscillator circuit 15.

The disclosure above refers to specific embodiments. However, other embodiments than the above described are possible within the scope of the invention. For example, the oscillator circuit 15 may be used in other types of electronic apparatuses than communication apparatuses. The different features and steps of the embodiments may be combined in other combinations than those described.

The invention claimed is:

1. An oscillator circuit comprising
N amplifier circuits ($A_1$-$A_N$), in the following numbered 1 to N, wherein for each $j \in \{1, 2, \ldots, N-1\}$, an output (out) of amplifier circuit j ($A_j$) is connected to an input (in) of the amplifier circuit j+1 ($A_{j+1}$), the output of the amplifier circuit N ($A_N$) is connected to the input of the amplifier circuit 1 ($A_1$);
a first and a second supply terminal ($s_1$, $s_2$) configured to receive a supply voltage between the first and the second supply terminal ($s_1$, $s_2$); and
each of the N amplifier circuits ($A_1$-$A_N$) comprising:
an input transistor ($M_1$) having its gate connected to the input (in) of the amplifier circuit, its drain connected to an internal node (x) of the amplifier circuit, and its source connected to the first supply terminal ($s_1$);
a first resonance circuit ($R_1$) comprising a first inductor ($L_S$) and a first capacitor ($C_S$), wherein the first inductor ($L_S$) is connected between the internal node (x) and the output (out) of the amplifier circuit, and the first capacitor ($C_S$) is connected between the output (out) of the amplifier circuit and one of the first and the second supply terminals ($s_1$, $s_2$); and
a second resonance circuit ($R_2$) comprising a second inductor ($L_P$) and a second capacitor ($C_P$), wherein the second inductor ($L_P$) and the second capacitor ($C_P$) are connected in parallel between the internal node (x) and the second supply terminal ($s_2$).

2. The oscillator circuit of claim 1, wherein N=4.

3. The oscillator circuit of claim 2, comprising
a first transistor ($M_{P1}$) having its gate connected to the output (out) of amplifier circuit 3 ($A_3$), its source connected to the first supply terminal ($s_1$), and its drain connected the drain of the input transistor ($M_1$) of amplifier circuit 1 ($A_1$);
a second transistor ($M_{P2}$) having its gate connected to the output (out) of amplifier circuit 4 ($A_4$), its source connected to the first supply terminal ($s_1$), and its drain connected the drain of the input transistor ($M_1$) of amplifier circuit 2 ($A_2$);
a third transistor ($M_{P3}$) having its gate connected to the output (out) of amplifier circuit 1 ($A_1$), its source connected to the first supply terminal ($s_1$), and its drain connected the drain of the input transistor ($M_1$) of amplifier circuit 3 ($A_3$); and
a fourth transistor ($M_{P4}$) having its gate connected to the output (out) of amplifier circuit 2 ($A_2$), its source connected to the first supply terminal ($s_1$), and its drain connected the drain of the input transistor ($M_1$) of amplifier circuit 4 ($A_4$).

4. The oscillator circuit of claim 2, wherein each amplifier circuit ($A_1$-$A_4$) comprises a further transistor ($M_2$) connecting the source of the input transistor ($M_1$) of the same amplifier circuit ($A_1$-$A_4$) to the first supply terminal ($s_1$), wherein the drain of the further transistor ($M_2$) is connected to the source of the input transistor ($M_1$) of the same amplifier circuit ($A_1$-$A_4$) and the source of the further transistor ($M_2$) is connected to the first supply terminal ($s_1$), and wherein
the gate of the further transistor ($M_2$) of amplifier circuit 1 ($A_1$) is connected to the output of the amplifier circuit 3 ($A_3$);
the gate of the further transistor ($M_2$) of amplifier circuit 2 ($A_2$) is connected to the output of the amplifier circuit 4 ($A_4$);
the gate of the further transistor ($M_2$) of amplifier circuit 3 ($A_3$) is connected to the output of the amplifier circuit 1 ($A_1$); and
the gate of the further transistor ($M_2$) of amplifier circuit 4 ($A_4$) is connected to the output of the amplifier circuit 2 ($A_2$).

5. The oscillator circuit of claim 1, wherein each of the N amplifier circuits ($A_1$-$A_N$) comprises an attenuator circuit ($ATT_{in}$) connecting the gate of the input transistor ($M_1$) to the input (in) of the amplifier circuit ($A_j$).

6. The oscillator circuit of claim 1, wherein each of the N amplifier circuits ($A_1$-$A_N$) comprises a cascode transistor ($M_{casc}$) connecting the drain of the input transistor ($M_1$) to the internal node (x).

7. The oscillator circuit of claim 1, wherein the first resonance circuit ($R_1$) is configured to have a first resonance frequency $f_0$ and the second resonance circuit ($R_2$) is configured to have a second resonance frequency $f_P \geq 2f_0$.

8. The oscillator circuit of claim 7, wherein $f_P$ is an integer multiple of $f_0$.

9. The oscillator circuit of claim 1, wherein the oscillator circuit is a voltage-controlled oscillator circuit.

10. The oscillator circuit of claim 1, wherein the oscillator circuit is a digitally-controlled oscillator circuit.

11. A frequency synthesizer circuit comprising the oscillator circuit of claim 1.

12. The frequency synthesizer circuit of claim 11, wherein the frequency synthesizer circuit is a phase-locked loop circuit.

13. An integrated circuit comprising the oscillator circuit of claim 1.

14. An electronic apparatus comprising the oscillator circuit of claim 1.

15. The electronic apparatus of claim 14, wherein the electronic apparatus is a communication apparatus.

16. The electronic apparatus of claim 15, wherein the communication apparatus is a wireless communication device for a cellular communications system.

17. The electronic apparatus of claim 15, wherein the communication apparatus is a base station for a cellular communications system.

* * * * *